United States Patent
Braun (10) Patent No.: US 7,099,186 B1
(45) Date of Patent: Aug. 29, 2006

(54) DOUBLE-DECKER MRAM CELLS WITH SCISSOR-STATE ANGLED REFERENCE LAYER MAGNETIC ANISOTROPY AND METHOD FOR FABRICATING

(75) Inventor: Daniel Braun, Paris (FR)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 1 day.

(21) Appl. No.: 11/054,735

(22) Filed: Feb. 10, 2005

(51) Int. Cl.
    *G11C 7/00* (2006.01)
(52) U.S. Cl. ..................... 365/158; 365/171
(58) Field of Classification Search ........... 365/158, 365/171, 145
    See application file for complete search history.

(56) References Cited

U.S. PATENT DOCUMENTS 6,385,082 B1 * 5/2002 Abraham et al. ........... 365/171
6,667,897 B1 * 12/2003 Abraham et al. ........... 365/145
6,754,097 B1 * 6/2004 Sharma et al. .............. 365/158
2004/0042263 A1 * 3/2004 Sharma et al. .............. 365/158

OTHER PUBLICATIONS

Cullity, B.D., "Introduction to Magnetic Materials," Addison-Wesley, pp. 238-240 (1972).

* cited by examiner

*Primary Examiner*—Vu A. Le
(74) *Attorney, Agent, or Firm*—Dicke, Billig & Czaja, PLLC (57) ABSTRACT

A double-decker MRAM cell is provided, including a stacked structure of first and second magnetic tunnel junctions. Each magnetic tunnel junction includes free and fixed magnetic regions made of magnetic material separated by a tunneling barrier layer made of non-magnetic material. The fixed magnetic regions are pinned by at least one pinning layer made of the same antiferromagnetic material such that in applying an external magnetic field fixed magnetizations are brought into a scissored configuration.

20 Claims, 5 Drawing Sheets

DOUBLE-DECKER MRAM CELLS WITH SCISSOR-STATE ANGLED REFERENCE LAYER MAGNETIC ANISOTROPY AND METHOD FOR FABRICATING

CROSS-REFERENCE TO RELATED APPLICATIONS

This Patent Application is also related to Utility patent application Ser. No. 11/054,854, filed on even date herewith, entitled "DOUBLE-DECKER MRAM CELLS WITH ROTATED REFERENCE LAYER MAGNETIZATIONS," and is commonly assigned to the same assignee as the present invention, and which is herein incorporated by reference.

BACKGROUND

The present invention pertains to non-volatile semiconductor magnetoresistive random access memory (MRAM) chips. More particularly, the invention relates to so-called double-decker MRAM cells where each one of the cells comprises two stacks of magnetic tunnel junctions, and a method for making the same.

MRAM technology is a non-volatile random access memory technology that may probably replace present random access memories as the standard memory technology for computing devices. An MRAM cell (also referred to as a tunneling magnetoresistive or TMR-device) includes a structure having ferromagnetic layers respectively exhibiting a resultant magnetic moment vector separated by a non-magnetic layer (or tunneling barrier) and arranged into a magnetic tunnel junction (MTJ). In contrast to present day's non-volatile DRAM memory technology, digital information is not stored by power but rather is represented in the MRAM cell as directions of magnetic moment vectors (magnetization) in the ferromagnetic layers. More specifically, the magnetic moment vector of one ferromagnetic layer is magnetically fixed (or pinned), while the magnetic moment vector of the other ferromagnetic layer is free to be switched between the two preferred directions in the magnetization easy axis, which typically is arranged to be aligned with the fixed magnetization of the reference layer. Hence, a memory state of an MRAM cell is maintained by the direction of the magnetization of the free layer with respect to the direction of the magnetization of the reference layer.

Depending upon the two different magnetic states of the free layer, the MRAM cell exhibits two different resistance values in response to a voltage applied across the magnetic tunneling junction barrier. Accordingly, the particular resistance of the TMR-device reflects the magnetization state of the free layer. In this way, the resistance is low when the magnetization of the free layer is parallel to the magnetization of the reference layer, and high when magnetizations are antiparallel. Hence, a detection of changes in resistance allows to provide information stored in the MRAM cell.

In order to switch MRAM cells, magnetic fields that are coupled to the freely switchable magnetization of the magnetic free layer are applied, which typically are generated by supplying currents to current lines, for example, write bit and write word lines, usually crossing at right angles with an MRAM cell being positioned in an intermediate position therebetween and at an intersection thereof.

Recently, a new concept of MRAM cells ("toggle cells") has been proposed, wherein the free layer is designed to be a free magnetic region including a number of ferromagnetic layers that are antiferromagnetically coupled, where the number of antiferromagnetically coupled ferromagnetic layers may be appropriately chosen to increase the effective magnetic switching volume of the MRAM device. See, for instance, U.S. Pat. No. 6,531,723 B1 to Engel et al., the disclosure of which is incorporated herein by reference.

For switching such magnetoresistive memory cells having a free magnetic region including antiferromagnetically coupled ferromagnetic layers, another switching mechanism, the so-called "adiabatic rotational switching", which is well-known to the skilled persons, is envisaged. The adiabatic rotational switching mechanism is, for example, disclosed in U.S. Pat. No. 6,545,906 B1 to Savtchenko et al., the disclosure of which is incorporated herein by reference. More specifically, adiabatic rotational switching relies on the "spin-flop" phenomenon, which lowers the total magnetic energy in an applied magnetic field by rotating the magnetic moment vectors of the magnetic free region ferromagnetic layers.

Figure 1A:
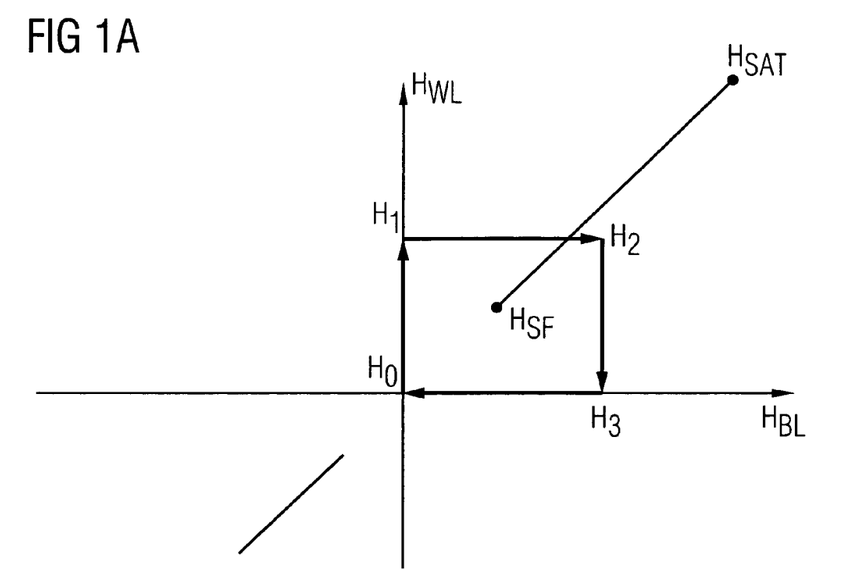
FIGS. 1A and 1B illustrate stability diagrams of prior art toggle cells in which toggle switching scenarios relating to a single-MTJ toggle cell (FIG. 1A) and to a two-MTJ (double-decker) toggle cell (FIG. 1B) are illustrated.

Now reference is made to FIG. 1A, where a typical stability diagram for an adiabatic rotation switchable MRAM cell is illustrated, the abscisse of which represents the bit line magnetic field $H_{BL}$, while the ordinate represents the word line magnetic field $H_{WL}$, which respectively arrive at the MRAM cell for its switching. Using the spin-flop phenomenon in an MRAM cell having antiferromagnetically coupled magnetic moment vectors $M_1$ and $M_2$ of the free magnetic region ferromagnetic layers inclined at a 45° angle to the word and bit lines, respectively, a timed switching pulse sequence of applied magnetic fields in a typical "toggling write" mode is described as follows.

At a time $t_0$ neither a word line current nor a bit line current are applied resulting in a zero magnetic field $H_0$ of both $H_{BL}$ and $H_{WL}$. At a time t1, the word line current is increased to result in magnetic field $H_1$ and magnetic moment vectors $M_1$ and $M_2$ begin to rotate either clockwise or counter-clockwise, depending on the direction of the word line current, to align themselves nominally orthogonal to the field direction. At a time $t_2$, the bit line current is switched on. The bit line current is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being nominally orthogonal to the net magnetic field direction, which is 45° with respect to the current lines.

At a time $t_3$, the word line current is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa, depending on the state switching ("toggling") starts off with.

In order to successfully switch the MRAM cell, it is essential that magnetic field sequence applied thereon results in a magnetic field path crossing a diagonal line being a straight connection between a minimum switching field $H_{SF}$ ("toggling point") for reversal of the free magnetization and another critical magnetic field value $H_{SAT}$ ("saturation point"), at which both magnetic moment vectors $M_1$ and $M_2$ of antiferromagnetically coupled ferromagnetic layers of the free magnetic region are forced to align with the applied external magnetic field in a parallel configuration.

Usually, the first and third quadrant of the $H_{BL}$–$H_{WL}$-plane are used for switching the cell. Apparently, as can be seen from FIG. 1A, no magnetic fields are applied in the second and fourth quadrant leaving room to operate another (second) magnetic tunnel junction in the same memory cell, the reference layer magnetization is rotated by 90 degrees relative to the first one.

Figure 1B:
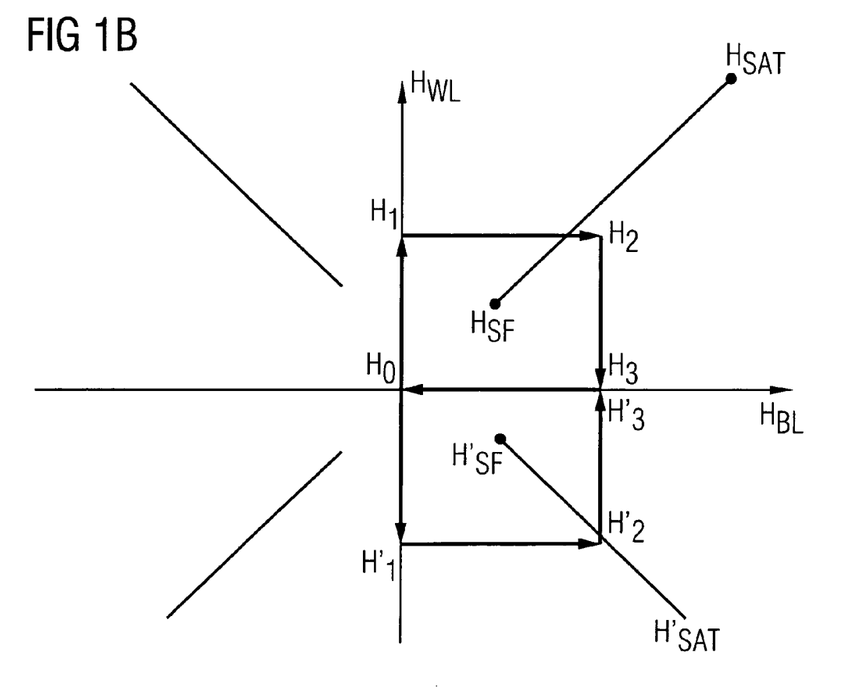

Reference is now made to FIG. 1B. Assuming a second magnetic tunnel junction similar to above (first) magnetic tunnel junction except for a 90° angled reference layer magnetization, a timed switching pulse sequence of applied magnetic fields in the second quadrant is typically as follows: a time $t_0$ neither a word line current nor a bit line current are applied resulting in a zero magnetic field $H_0$ of both $H_{BL}$ and $H_{WL}$. At a time t1, the word line current being reversed to the previous case is increased to result in magnetic field $H_1$ and magnetic moment vectors $M_1$ and $M_2$ of the second MTJ begin to rotate either clockwise or counter-clockwise, depending on the direction of the word line current, to align themselves nominally orthogonal to the field direction. At a time $t_2$, the bit line current is switched on. The bit line current is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being nominally orthogonal to the net magnetic field direction, which is 45° with respect to the current lines. At a time $t_3$, the word line current is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the second MTJ of the MRAM cell has been switched from its parallel state into its anti-parallel state, or vice versa, depending on the state switching starts off with. As with the first cell, magnetic field sequence applied on the second MTJ crosses a diagonal line being a straight connection between a minimum switching field $H_{SF}$ for reversal of the free magnetization and another critical magnetic field value $H_{SAT}$, at which both magnetic moment vectors $M_1$ and $M_2$ of antiferromagnetically coupled ferromagnetic layers of the free magnetic region are forced to align with the applied external magnetic field in a parallel configuration.

Figure 2:
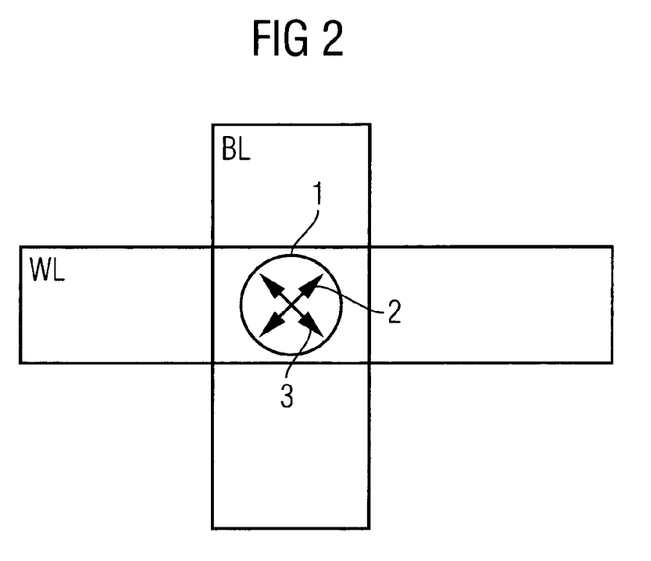
FIG. 2 illustrates a typical configuration of a double-decker toggle cell.

As above described, in order to successfully switch two different MTJs in a single memory cell, it is necessary that reference layer magnetizations are inclined at an angle of 90°. Such situation is illustrated in FIG. 2, where a stacked structure 1 of two magnetic tunnel junctions (MTJs) of a memory cell is positioned in between bit and word lines at an intersection thereof and having reference layer magnetizations 2, 3 exhibiting a 90° angle in between. (FIG. 2 illustrates different cases of orientations of the two reference layer magnetizations, each one having a 90° angle in between.)

A possible realization of two different MTJs in a single cell is the so-called "double-decker MRAM cell"-concept having a stacked structure of two MTJs. Using such a double-decker MRAM cell allows for storing two bits of information ($1^{st}$ and $2^{nd}$ bit) in a single memory cell. Thus, half the effective cell size per MTJ as compared to the convenient case having only one MTJ per memory cell can be achieved. However, in such double-decker MRAM cell, reference layer magnetizations have to be inclined in an angle of 90° in order to selectively switch the MTJs for which reason the pinning layers for pinning of the reference layers in the state of the art necessarily have to be made of different antiferromagnetic materials having sufficiently different setting (Neel) temperatures. Accordingly, optimizing the antiferromagnetic materials such that they have as high a difference in setting temperatures as possible while meeting other requirements like pinning strength, thermal stability etc. is a big challenge and often results in a rather dissatisfying trade-off of desired characteristics. Accordingly, there is a need for the present invention.

SUMMARY

One embodiment of the present invention includes a double-decker MRAM cell with a stacked structure and a method of fabricating the same. The stacked structure has first and second magnetic tunnel junctions. Each of the magnetic tunnel junctions include free and fixed magnetic regions made of magnetic material separated by a tunneling barrier layer made of non-magnetic material. The fixed magnetic regions are pinned by at least one pinning layer made of the same antiferromagnetic material such that in applying an external magnetic field fixed magnetizations are brought into a scissored configuration.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one embodiment of the invention, a double-decker MRAM cell is provided having two MTJs in a single cell without the need of necessarily choosing different antiferromagnetic materials for the pinning layers for pinning of reference layers in both MTJs.

In one embodiment of the invention, a method of producing a double-decker magnetoresistive random access memory (MRAM) cell is given, which includes the step of providing a stacked structure having first and second magnetic tunnel junctions (MTJs). In such stacked structure, the first MTJ includes first and second magnetic regions made of magnetic material being stacked in a parallel, overlying relationship separated by a first tunneling barrier layer made of non-magnetic material. The first magnetic region includes a first pinned layer (or reference layer) having a first fixed magnetization adjacent the first tunneling barrier layer, while the second magnetic region exhibits a first free magnetization adjacent the first tunneling barrier layer which is free to be switched between the same and opposite directions with respect to the first fixed magnetization of the first magnetic region. Further, in such stacked structure, the second MTJ includes third and fourth magnetic regions made of magnetic material being stacked in a parallel, overlying relationship separated by a second tunneling barrier layer made of non-magnetic material. The third magnetic region includes a second pinned layer (or reference layer) having a second fixed magnetization adjacent the second tunneling barrier layer, while the fourth magnetic region exhibits a second free magnetization adjacent the second tunneling barrier layer which is free to be switched between the same and opposite directions with respect to the second fixed magnetization of the third magnetic region of the second MTJ.

In such stacked structure, the free magnetizations of the first and second MTJs are magnetically coupled to magnetic fields generated by first and second currents made to flow through first and second current lines, respectively. In order to practically realize the first and second fixed magnetizations these are pinned by first and second pinning layers, respectively, made of first and second antiferromagnetic materials. The first and second antiferromagnetic materials may be chosen to be the same material. Also, the first and second pinned layers (first and second fixed magnetizations) are coupled antiferromagnetically, for example, via magnetostatic interaction and have a sufficiently small intrinsic magnetic anisotropy such that in applying an external magnetic field the first and second fixed magnetizations are brought into a so-called "scissored configuration." In a scissored configuration the first fixed magnetization is inclined under a first angle relative to the external magnetic field and the second fixed magnetization is inclined under a second angle relative to the external magnetic field, such that an angle between the first and second fixed magnetizations lies in a range of from 60° to 120° to allow for a proper discrimination between the four resistance values.

In one case, the above angle between the first and second fixed magnetizations amounts to about 90° resulting in an arrangement similar to the conventional case where both fixed magnetizations are perpendicularly aligned. In the latter case, the first and second angles have about the same absolute values and opposite signs.

For a more detailed description of the scissored configuration, see B. D. Cullity, Introduction to Magnetic Materials, pages 239–240, the disclosure of which is incorporated herein by reference.

In accordance with one method of the invention, it is possible to use the same material for both first and second pinning layers thus avoiding to be forced to select two antiferromagnetic materials having substantially different setting temperatures. Thus, a stacked double-decker MRAM cell can be realized in which the two ferromagnetic fixed (pinned) layers are pinned by the same antiferromagnetic material. Upon doing so, it is possible to arrange two separate antiferromagnetic pinning layers made of the same material, and, alternatively, even a single antiferromagnetic pinning layer of that material may be provided, if it is thick enough.

According to one embodiment of the invention, a method of producing a double-decker MRAM cell is given, in that the first and second fixed magnetizations respectively are pinned by a (single) pinning layer made of antiferromagnetic material which has a small intrinsic anisotropy such that a further step is enabled, wherein, in applying an external magnetic field, the first and second fixed magnetizations are brought into above-described scissored configuration.

In one embodiment of the invention, selecting different magnitudes of the applied external magnetic field will result in different angles of first and second fixed magnetizations relative to the direction of the external magnetic field.

Provided that fixed magnetizations are aligned with one of the first and second current lines crossing at right angles before they are brought into their scissored configuration, the external magnetic field is applied in one case in direction of that one of the first and second current lines to then obtain a scissored configuration of first and second fixed magnetizations which are respectively inclined in an angle of 45° to each one of the first and second current lines.

According to one embodiment of the invention, the second and fourth magnetic regions respectively are comprised of a plurality of N ferromagnetic free layers which are antiferromagnetically coupled, where N is an integer greater than or equal to two. In another case, the second and fourth magnetic regions respectively are comprised of a tri-layered structure including two ferromagnetic layers being antiferromagnetically coupled by an intermediate layer made of antiferromagnetic coupling material.

Figure 3:
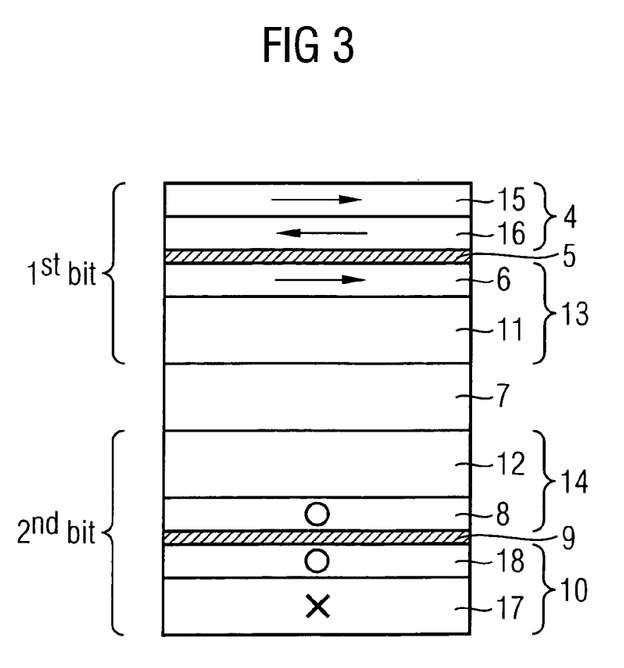
FIG. 3 illustrates a cross-sectional view of a double-decker toggle cell according to one embodiment of the invention.

FIG. 3 illustrates a cross-sectional view of a double-decker toggle cell according to one embodiment of the present invention. In one case, a double-decker toggle cell is fabricated which includes a first MTJ with first and second magnetic regions 13, 4. First and second magnetic regions 13, 4 are made of magnetic material stacked in a parallel, overlying relationship and are separated by a first tunneling barrier layer 5, which is made of non-magnetic material. The cell also includes a second MTJ that similarly includes third and fourth magnetic regions 14, 10. Third and fourth magnetic regions 14, 10 are made of magnetic material stacked in a parallel, overlying relationship and are separated by a second tunneling barrier layer 9, which is made of non-magnetic material. First and second MTJs are separated by conductive layer 7. Each one of the first and third magnetic regions 13, 14 of the first and second MTJs, respectively, includes a pinned magnetization reference layer 6, 8, which respectively are pinned by antiferromagnetic pinning layers 11, 12. The second and fourth magnetic regions 4, 10 of both MTJs exhibit a free magnetization adjacent their respective tunneling barrier layers 5, 9, which is free to be switched between the same and opposite directions with respect to the fixed magnetization of the respective reference layer 6, 8 fixed magnetizations. Further, the second and fourth magnetic regions 4, 10 of both MTJs, respectively, include a tri-layered structure including two ferromagnetic layers 15, 16 and 17, 18 being antiferromagnetically coupled by an intermediate layer (not shown in the drawings) made of antiferromagnetic coupling material.

According to one embodiment of the invention, first and second antiferromagnetic materials of antiferromagnetic pinning layers 11, 12 are chosen to be made of the same material. Additionally, the first and second pinned layers 6, 8 are antiferromagnetically coupled and have a sufficiently small intrinsic magnetic anisotropy such that in applying an external magnetic field a scissored configuration of the first and second fixed magnetizations is enabled.

According to one embodiment of the invention, first and second fixed magnetizations have been brought into the scissored configuration in applying a magnetic external field. In the scissored configuration of FIG. 3, an approximately orthogonal alignment of fixed magnetizations of the reference layers 6, 8 is achieved by applying an appropriately sized external magnetic field. In other words, an absolute value of a difference of the first and second angles, that is, an angle between the first fixed magnetization and the second fixed magnetization amounts to about 90° resulting in an arrangement similar to the conventional case where both fixed magnetizations are perpendicularly aligned. First fixed magnetization of first reference layer 6 is in parallel alignment to free magnetizations of the first magnetic region, and, second fixed magnetization of second reference layer 8 is in parallel alignment to free magnetizations of the second magnetic region. In one case, both first and second fixed magnetizations being orthogonally aligned are inclined in an angle of 45° to each one of the first and second current lines (for instance bit and word lines).

Figure 4A:
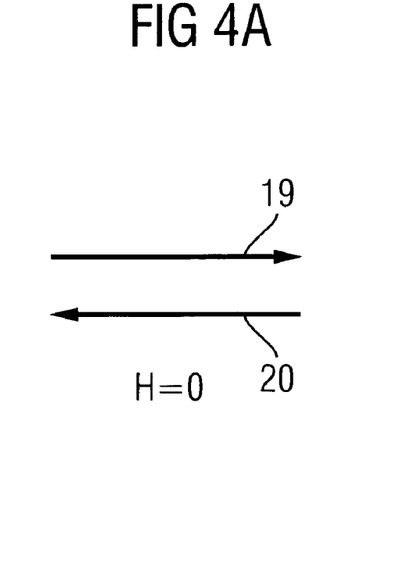
FIGS. 4A and 4B illustrate a configuration of fixed magnetizations without having applied an external magnetic field (FIG. 4A) and in their scissored configuration (FIG. 4B) after having applied a magnetic field.
Figure 4B:
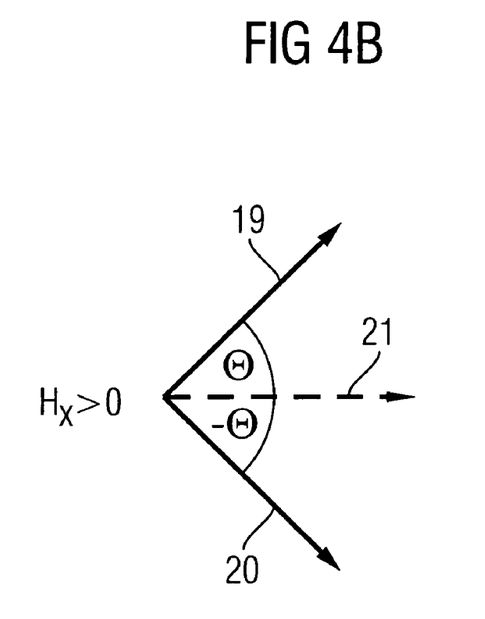

FIGS. 4A and 4B illustrate a configuration of first and second fixed magnetizations in the double-decker MRAM cell of FIG. 3 without having applied an external magnetic field (FIG. 4A) and in their scissored configuration (FIG. 4B) after having applied an external magnetic field. Accordingly, first 19 and second 20 fixed magnetizations, without having applied an external magnetic field, are oppositely directed due to antiferromagnetism. Applying an external magnetic field 21 ($H_x$) results in a new orientation of both first and second fixed magnetizations into their scissored state having a first angle $\Theta$ between first fixed magnetization 19 and magnetic field 21 and a second angle $-\Theta$ between second fixed magnetization 20 and magnetic field 21, where first and second angles $\Theta$, $-\Theta$ have the same absolute value and different signs. The absolute values of both first and second angles $\Theta$, $-\Theta$ respectively amount to approximately 45° resulting in a sum (absolute value) of approximately 90°.

FIGS. 5A through 5D illustrate respective cross-sectional views of double-decker toggle cells according to alternative embodiments of the invention. In order to avoid unnecessary repetitions, only the differences as to the embodiment of FIG. 3 are explained, otherwise reference is made to the description made in connection with FIG. 3.

Figure 5A:
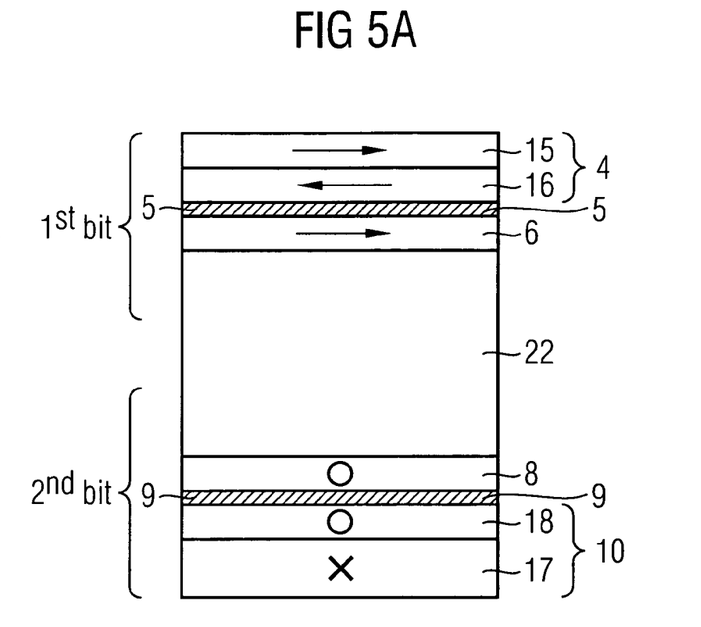
FIGS. 5A to 5D illustrate respective cross-sectional views of double-decker toggle cells according to alternative embodiments of the invention.

FIG. 5A illustrates an embodiment having a single antiferromagnetic pinning layer 22 instead of first and second antiferromagnetic pinning layers 11, 12 as in FIG. 3. The single antiferromagnetic pinning layer 22 has to be sufficiently thick to ensure pinning action for both first and second fixed magnetizations of first 6 and second 8 reference layers.

Figure 5B:
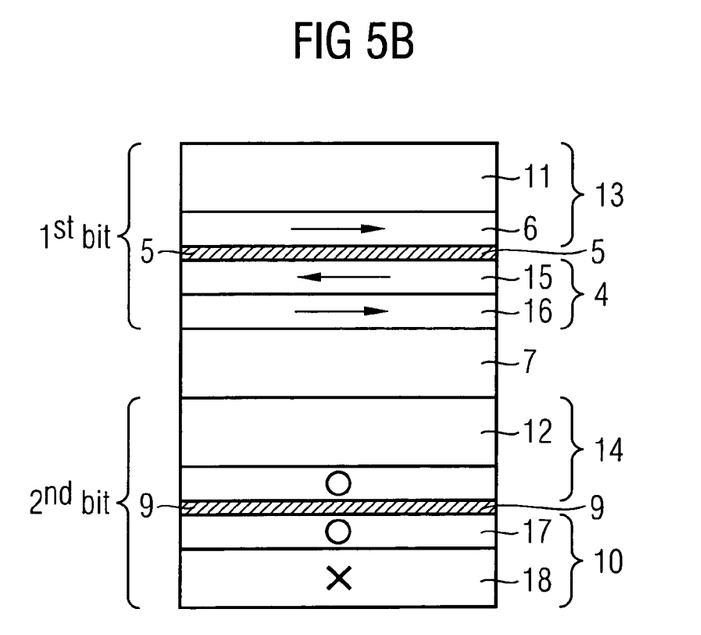
Figure 5C:
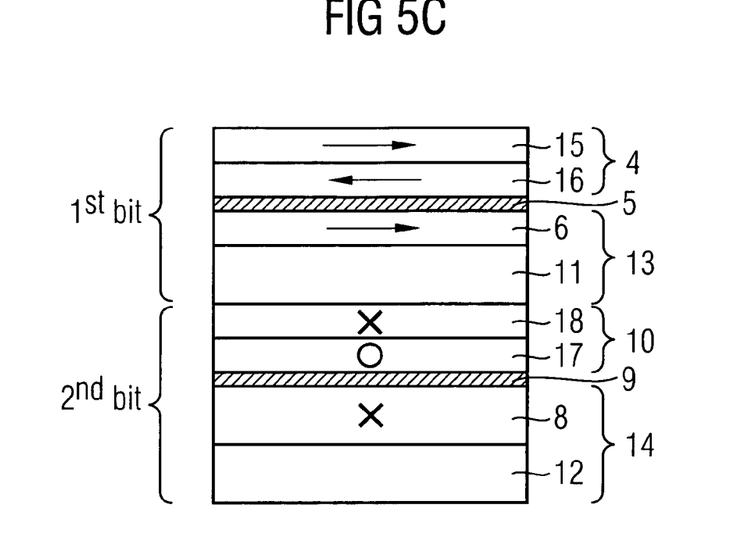
Figure 5D:
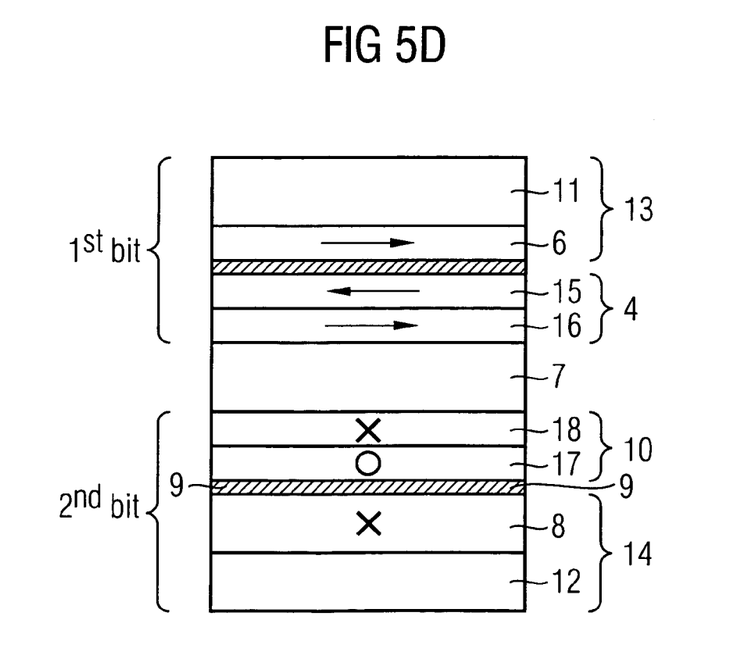

FIGS. 5B to 5D illustrate different cases similar to FIG. 3, where each system comprised of antiferromagnetic pinning layer and reference layer is varied to be arranged on top/bottom of antiferromagnetically coupled ferromagnetic free regions, that is, second and fourth magnetic regions. FIG. 5B illustrates an embodiment having the first magnetic region 13 comprised of antiferromagnetic pinning layer 11 and reference layer 6 arranged on top of the second magnetic region 4 separated by the first tunneling barrier layer 5. FIG. 5C illustrates an embodiment having the third magnetic region 14 comprised of antiferromagnetic pinning layer 12 and reference layer 8 arranged at the bottom of the fourth magnetic region 10 separated by the second tunneling barrier layer 9. FIG. 5D illustrates an embodiment having the first magnetic region 13 comprised of antiferromagnetic pinning layer 11 and reference layer 6 arranged on top of the second magnetic region 4 separated by the first tunneling barrier layer 5 and also having the third magnetic region 14 comprised of antiferromagnetic pinning layer 12 and reference layer 8 arranged at the bottom of the fourth magnetic region 10 separated by the second tunneling barrier layer 9.

Obviously many modifications and variations of the present invention are possible in light of the above description. It is therefore to be understood, that within the scope of appended claims, the invention may be practiced otherwise than as specifically devised.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a double-decker magnetoresistive random access memory cell comprising:
    providing a stacked structure having a first magnetic tunnel junction including first and second magnetic regions made of magnetic material being stacked in a parallel, overlying relationship separated by a first tunneling barrier layer made of non-magnetic material;
    said first magnetic region of said first magnetic tunnel junction comprising a first pinned layer having a first fixed magnetization adjacent said first tunneling barrier layer, said second magnetic region of said first magnetic tunnel junction exhibiting a first free magnetization adjacent said first tunneling barrier layer which is free to be switched between the same and opposite directions with respect to the first fixed magnetization of said first magnetic region of said first magnetic tunnel junction;
    said stacked structure further having a second magnetic tunnel junction including third and fourth magnetic regions made of magnetic material being stacked in a parallel, overlying relationship separated by a second tunneling barrier layer made of non-magnetic material;

said third magnetic region of said second magnetic tunnel junction comprising a second pinned layer having a second fixed magnetization adjacent said second tunneling barrier layer, said fourth magnetic region of said second magnetic tunnel junction exhibiting a second free magnetization adjacent said second tunneling barrier layer which is free to be switched between the same and opposite directions with respect to the second fixed magnetization of said third magnetic region of said second magnetic tunnel junction;

said free magnetizations of said first and second magnetic tunnel junctions being magnetically coupled to magnetic fields generated by first and second currents made to flow through first and second current lines, respectively; and pinning said first fixed magnetization with a first pinning layer made of a first antiferromagnetic material and pinning said second fixed magnetization with a second pinning layer made of a second antiferromagnetic material;

antiferromagnetically coupling said first and second pinned layers, the pinned layers having a small intrinsic anisotropy such that a further step is enabled.

2. The method of claim 1, further including applying an external magnetic field such that said first and second fixed magnetizations are brought into a scissored configuration where the first fixed magnetization is inclined under a first angle relative to the external magnetic field and the second fixed magnetization is inclined under a second angle relative to the external magnetic field.

3. The method of claim 2, wherein an angle between the first and second fixed magnetizations is in a range of from 60° to 120°.

4. The method of claim 2, further including selecting a magnitude of said applied external magnetic field such that an absolute value of a difference of said first and second angles amounts to approximately 90°.

5. The method of claim 2, further including applying said external magnetic field in the direction of one of said first and second fixed magnetizations.

6. The method of claim 2, wherein said second and fourth magnetic regions respectively being comprised of a plurality of N ferromagnetic free layers which are antiferromagnetically coupled, where N is an integer greater than or equal to two.

7. The method of claim 6, wherein said second and fourth magnetic regions respectively being comprised of a tri-layered structure including two ferromagnetic layers being antiferromagnetically coupled by an intermediate layer made of antiferromagnetic coupling material.

8. The method of claim 2, further including applying said external magnetic field in direction of one of said first and second current lines.

9. The method of claim 2, further including selecting the same antiferromagnetic material for the first and second pinning layers in the first and second magnetic tunnel junctions.

10. The method of claim 2, further including selecting a different antiferromagnetic material for the first and second pinning layers in the first and second magnetic tunnel junctions.

11. A method of producing a double-decker magnetoresistive random access memory cell comprising:

providing a stacked structure having a first magnetic tunnel junction including first and second magnetic regions made of magnetic material being stacked in a parallel, overlying relationship separated by a first tunneling barrier layer made of non-magnetic material;

said first magnetic region of said first magnetic tunnel junction comprising a first pinned layer having a first fixed magnetization adjacent said first tunneling barrier layer, said second magnetic region of said first magnetic tunnel junction exhibiting a first free magnetization adjacent said first tunneling barrier layer which is free to be switched between the same and opposite directions with respect to the first fixed magnetization of said first magnetic region of said first magnetic tunnel junction;

said stacked structure further having a second magnetic tunnel junction including third and fourth magnetic regions made of magnetic material being stacked in a parallel, overlying relationship separated by a second tunneling barrier layer made of non-magnetic material;

said third magnetic region of said second magnetic tunnel junction comprising a second pinned layer having a second fixed magnetization adjacent said second tunneling barrier layer, said fourth magnetic region of said second magnetic tunnel junction exhibiting a second free magnetization adjacent said second tunneling barrier layer which is free to be switched between the same and opposite directions with respect to the second fixed magnetization of said third magnetic region of said second magnetic tunnel junction;

said free magnetizations of said first and second magnetic tunnel junctions being magnetically coupled to magnetic fields generated by first and second currents made to flow through first and second current lines, respectively;

pinning said first and second fixed magnetizations by a pinning layer made of antiferromagnetic material; and said first and second pinned layers being antiferromagnetically coupled and having a small intrinsic anisotropy such that a further step is enabled.

12. The method of claim 11, further including applying an external magnetic field such that said first and second fixed magnetizations are brought into a scissored configuration where the first fixed magnetization is inclined under a first angle relative to the external magnetic field and the second fixed magnetization is inclined under a second angle relative to the external magnetic field.

13. The method of claim 8, wherein an angle between the first and second fixed magnetizations is in a range of from 60° to 120°.

14. The method of claim 12, further including selecting a magnitude of said applied external magnetic field such that an absolute value of a difference of said first and second angles amounts to approximately 90°.

15. The method of claim 12, further including applying said external magnetic field in the direction of one of said first and second fixed magnetizations.

16. The method of claim 12, wherein said second and fourth magnetic regions respectively being comprised of a plurality of N ferromagnetic free layers which are antiferromagnetically coupled, where N is an integer greater than or equal to two.

17. The method of claim 16, wherein said second and fourth magnetic regions respectively being comprised of a tri-layered structure including two ferromagnetic layers being antiferromagnetically coupled by an intermediate layer made of antiferromagnetic coupling material.

18. The method of claim 12, further including applying said external magnetic field in direction of one of said first and second current lines.

19. The method of claim 12, further including selecting the same antiferromagnetic material for the first and second pinning layers in the first and second magnetic tunnel junctions.

20. The method of claim 12, further including selecting a different antiferromagnetic material for the first and second pinning layers in the first and second magnetic tunnel junctions.

* * * * *